United States Patent [19]
Ohmura

[11] Patent Number: 5,514,976
[45] Date of Patent: May 7, 1996

[54] SEMICONDUCTOR TEST APPARATUS HAVING IMPROVED CURRENT LOAD CIRCUIT

[75] Inventor: Ryuuji Ohmura, Itami, Japan

[73] Assignee: Mitsubishi Denki Kabushiki Kaisha, Tokyo, Japan

[21] Appl. No.: 377,625

[22] Filed: Jan. 25, 1995

[30] Foreign Application Priority Data

Feb. 3, 1994 [JP] Japan .................................. 6-011754

[51] Int. Cl.⁶ .................................................. G01R 15/12
[52] U.S. Cl. ........................................ 324/765; 324/158.1
[58] Field of Search ............................. 324/158.1, 73.1, 324/765; 371/15.1, 22.1, 22.3, 22.6, 25.1; 437/8

[56] References Cited

U.S. PATENT DOCUMENTS

| | | | |
|---|---|---|---|
| 4,333,049 | 6/1982 | Yui et al. | 324/158.1 |
| 4,651,088 | 3/1987 | Sawada | 324/765 |
| 4,720,671 | 1/1988 | Tada et al. | 324/765 |

FOREIGN PATENT DOCUMENTS 4250373  9/1992  Japan .

OTHER PUBLICATIONS

Tsunetomo et al, "High Speed Testing Technique For CMOS LSI With High Impedance Transmission Lines", Technical Report of IEIEC ICD92–121, 1992, pp. 45–50.

*Primary Examiner*—Vinh P. Nguyen
*Attorney, Agent, or Firm*—Leydig, Voit & Mayer

[57] ABSTRACT

A semiconductor test apparatus including a current load circuit, by which ringing otherwise caused during a high-speed digital test can be prevented on both the overshoot and undershoot sides, is provided. In a current load circuit, a source current load circuit and a sink current load circuit are associated with a first current load switching voltage setting circuit and a second current load switching voltage setting circuit, respectively, which can be set separately so that high and low levels of the signal waveform are clamped to respective potentials to clip overshoot and undershoot in the ringing waveform. A rectifying diode circuit allows a sink current to flow when overshoot is about to occur, and allows a source current to flow when undershoot is about to occur.

5 Claims, 6 Drawing Sheets

6a 5,514,976

SEMICONDUCTOR TEST APPARATUS HAVING IMPROVED CURRENT LOAD CIRCUIT

BACKGROUND OF THE INVENTION

1. Field of the Invention

The present invention relates to a semiconductor test apparatus for testing high-speed digital LSIs and, more particularly, to a current load circuit in a pin electronics circuit which is provided for each of the pin terminals of a high-speed digital LSI and applies a test signal for measuring an output signal issued from the LSI in response to the test signal.

2. Description of the Related Art

FIG. 4 is a circuit diagram showing the connection relationship between a pin electronics circuit and a device to be tested in a prior art semiconductor test apparatus. While FIG. 4 illustrates the pin electronics circuit for one pin terminal of the tested device, the a similar circuit is provided for each of pin terminals of the tested device. These pin electronics circuits are controlled under supervision of a controller comprising a CPU or the like so that, for example, when one pin electronics circuit supplies a test signal to the pin terminal connected thereto, the pin electronics circuit connected to another pin terminal measures an output signal issued from the associated pin terminal pin in response to the test signal. The configuration of such a semiconductor test apparatus is disclosed in, e.g., Japanese Patent Laid-Open No. 4-250373 and will not described here in detail.

In FIG. 4, denoted by 1 is a device to be tested, i.e., a high-speed digital LSI, 2 is an output buffer circuit provided in the tested device 1 and having an output impedance R, 3 is a pin electronics circuit of the semiconductor test apparatus, 4 is a driver circuit for outputting a test logical waveform to the tested device 1, 5 is a comparator circuit including two comparators for L and H levels, respectively, to compare an output waveform from the tested device 1 with an expected value and determine whether both the values coincide with each other, 6 is a current load circuit for applying a current load to the tested device 1 and used, e.g., when holding a pin terminal 1a connected to the pin electronics circuit 3 in a high-impedance state "Hz", 7 is a coaxial cable as a transmission line connecting the tested device 1 and the pin electronics circuit 3 and having a characteristic impedance 8 is a current load switching voltage generator, and S is a strobe signal for switching over the circuits 4 to 6 so that the circuits are selectively brought into an operative state depending on the test to be performed.

FIG. 5 is an enlarged view of the current load circuit 6 in the pin electronics circuit 3 shown in FIG. 4. Referring to FIG. 5, denoted by 9 is a source current load circuit for setting a value of the current (hereinafter referred to as source current Isource) introduced to the tested device 1, 10 is a sink current load circuit for setting a value of the current (hereinafter referred to as sink current Isink) drawn out of the tested device 1, and 11 is a diode bridge control circuit for selecting either one of the source current and the sink current in accordance with a voltage value $V_T$ from the current load switching voltage generator 8.

Assuming that the output voltage of the output buffer circuit 2 in the tested device 1 is $V_{OUT}$, the sink current flows when there holds a relationship of;

$$V_{OUT} > V_T - V_D$$

and the source current flows when there holds a relationship of;

$$V_{OUT} > V_T + V_D$$

where $V_D$ is the potential across the diode of the diode bridge control circuit 71.

Signal waveforms produced in the circuit of FIG. 4 are shown in FIG. 6. Specifically, FIG. 6 illustrates typical input/output waveforms produced when the output impedance R of the output buffer circuit 2 is smaller than the characteristic impedance $Z_0$ of the coaxial cable 7, in which; (a) in FIG. 6 illustrates the output waveform from the tested device 1 (i.e., the waveform observed at a point A in FIG. 4), and (b) in FIG. 6 illustrates the input waveform at an entry to the comparator circuit 5 when the output of (a) is received by the pin electronics circuit 3 (i.e., the waveform observed at a point B in FIG. 4).

As seen from (b) in FIG. 6, the input waveform (i.e., the waveform observed at the point B) becomes the so-called ringing waveform including an overshoot indicated by a voltage $\Delta V_1$ and an undershoot indicated by a voltage $\Delta V_2$ with a reflection.

It is here assumed that the rise time of the output waveform of the output buffer circuit 2 in the tested device is Tr and the distance from the point A to the point B in FIG. 4 is L. Also, the H-level output potential of the output buffer circuit 2 is $V_{OH}$ and the L-level output potential thereof is $V_{OL}$ (see (a) in FIG. 6).

The operation of the prior art semiconductor test apparatus will be described below. As the operating speed of the tested device 1 is increased, the rise time Tr of the output waveform of the output buffer circuit 2 is generally shortened. If there holds a relationship of:

$$L \gg Tr/2 \cdot \tau$$

τ: signal transmission time per unit length of transmission line between the rise time Tr and the distance L from the output terminal (point A) of the tested device 1 to the input terminal (point B) of the comparator circuit 5, the transmission line is a distributed constant line. Under this condition, the output impedance R of the output buffer circuit 2 and the characteristic impedance $Z_0$ of the coaxial cable 7 are related to each other by;

$$Z_0 > R$$

resulting in a mismatch therebetween. Thus, the input signal applied to the pin electronics circuit 3 is subject to reflections on the input transmission line, and the ringing waveform as shown in (b) of FIG. 6 results. This means that the test cannot be correctly performed.

In the prior art pin electronics circuit 3, the ringing waveform can be shaped by using the current load circuit 6. However, since the current load switching voltage generator 8 can be set to only one voltage value $V_T$, it is only possible to shape either the overshoot indicated by $\Delta V_1$ or the undershoot indicated by $\Delta V_2$. An output waveform indicated by $B_1$ in FIG. 7 represents the one that results when the voltage value $V_T$ of the current load switching voltage generator 8 is set such that the low level of the output waveform is clamped to a potential adapted to clip the undershoot. In FIG. 7, the ringing waveform including the undershoot indicated by a dot line is shaped.

Here, the voltage value $V_T$ of the current load switching voltage generator 8 is set to $V_T = V_{OL} - V_D$ in consideration of the voltage $V_D$ across the diode.

In short, the prior art semiconductor test apparatus constructed as described above has the problem that, although the current load circuit is used to shape the ringing waveform, it can be set to only one voltage value, which results in the ringing waveform including either an overshoot or an undershoot and hence a test cannot be correctly performed.

SUMMARY OF THE INVENTION

In view of the problem described above, an object of the present invention is to improve the prior art current load circuit and to provide a semiconductor test apparatus which can shape the ringing waveform if both an overshoot and an undershoot occur.

To achieve the above object, a semiconductor test apparatus includes a current load circuit which comprises a source current load circuit for setting a source current introduced to a device to be tested, a sink current load circuit for setting a sink current drawn out of the tested device, first and second current load switching voltage setting circuits for setting respective desired voltages, first rectifying circuit means connected from the source current load circuit to a pin terminal of the tested device and to the first current load switching voltage setting circuit through a respective diode in the forward direction, and second rectifying circuit means connected from the sink current load circuit to the pin terminal of the tested device and from the second current load switching voltage setting circuit to the sink current load circuit through a respective diode in the backward direction.

A semiconductor test apparatus includes a current load circuit which comprises a source current load circuit for setting a value of a source current introduced to a device to be tested, a sink current load circuit for setting a sink current drawn out of the tested device, first and second variable current load switching voltage setting circuits for setting respective variable voltages, first rectifying circuit means connected from the source current load circuit to a pin terminal of the tested device and to the first variable current load switching voltage setting circuit through a respective diode in the forward direction, second rectifying circuit means connected from the sink current load circuit to the pin terminal of the tested device and from the second variable current load switching voltage setting circuit to the sink current load circuit through a respective diode in the backward direction, and means for changing the set voltages of the first and second variable current load switching voltage setting circuits in accordance with test procedures of the tested device.

A semiconductor test apparatus includes a current load circuit which comprises a source current load circuit for setting a source current introduced to a device to be tested, a sink current load circuit for setting a sink current drawn out of the tested device, first and second variable current load switching voltage setting circuits for setting respective variable voltages, first rectifying circuit means connected from the source current load circuit to a pin terminal of the tested device and to the first variable current load switching voltage setting circuit through a respective diode in the forward direction, second rectifying circuit means connected from the sink current load circuit to the pin terminal of the tested device and from the second variable current load switching voltage setting circuit to the sink current load circuit through a respective diode in the backward direction, and means for changing the set of the first and second variable current load switching voltage setting circuits in accordance with a microinstruction from a pattern generator of the semiconductor test apparatus.

A semiconductor test apparatus includes a current load circuit which comprises a source current load circuit for setting a source current introduced to a device to be tested, a sink current load circuit for setting a sink current drawn out of the tested device, first and second variable current load switching voltage setting circuits for setting respective variable voltages, first rectifying circuit means connected from the source current load circuit to a pin terminal of the tested device and to the first variable current load switching voltage setting circuit through a respective diode in the forward direction, second rectifying circuit means connected from the sink current load circuit to the pin terminal of the tested device and from the second variable current load switching voltage setting circuit to the sink current load circuit through a respective diode in the backward direction, and means for changing the set voltages of the first and second variable current load switching voltage setting circuits for each of the pin terminals of the tested device in accordance with a test pattern from a pattern generator of the semiconductor test apparatus.

A semiconductor test apparatus includes a current load circuit which comprises a source current load circuit for setting a source current introduced to a device to be tested, a sink current load circuit for setting a sink current drawn out of the tested device, first and second variable current load switching voltage setting circuits for setting respective variable voltages, first rectifying circuit means connected from the source current load circuit to a pin terminal of the tested device and to the first variable current load switching voltage setting circuit through a respective diode in the forward direction, second rectifying circuit means connected from the sink current load circuit to the pin terminal of the tested device and from the second variable current load switching voltage setting circuit to the sink current load circuit through a respective diode in the backward direction, and means including register circuits driven in accordance with a test pattern from a pattern generator of the semiconductor test apparatus and D/A converter circuits, the means changing the set voltages of the first and second variable current load switching voltage setting circuits for each of the pin terminals of the tested device.

In the semiconductor test apparatus, two current load switching voltage setting circuit in the current load circuits provided for dealing with an overshoot and an undershoot, respectively. These two current load switching voltage setting circuits can be set separately so that high and low levels of the signal waveform are clamped to respective potentials to clip an overshoot and an undershoot in the ringing waveform. Thus, a sink current flows when the overshoot is about to occur, and a source current flows when the undershoot is about to occur.

In the semiconductor test apparatus, the two current load switching voltage setting circuits provided in the current load circuit are each arranged to make the set voltages variable.

The set voltages are varied in accordance with the measurement procedures of the tested device. The set voltages are controlled particularly in accordance with a microinstruction from the pattern generator of the semiconductor test apparatus. The set voltages are controlled in accordance with the test pattern from the pattern generator. Further, the set voltages are controlled particularly by the register circuits driven in accordance with the test pattern from the pattern generator and the D/A converter circuits.

DETAILED DESCRIPTION OF THE PREFERRED EMBODIMENTS

A semiconductor test apparatus of the present invention will be hereinafter described with reference to the drawings.

Embodiment 1

Figure 1:
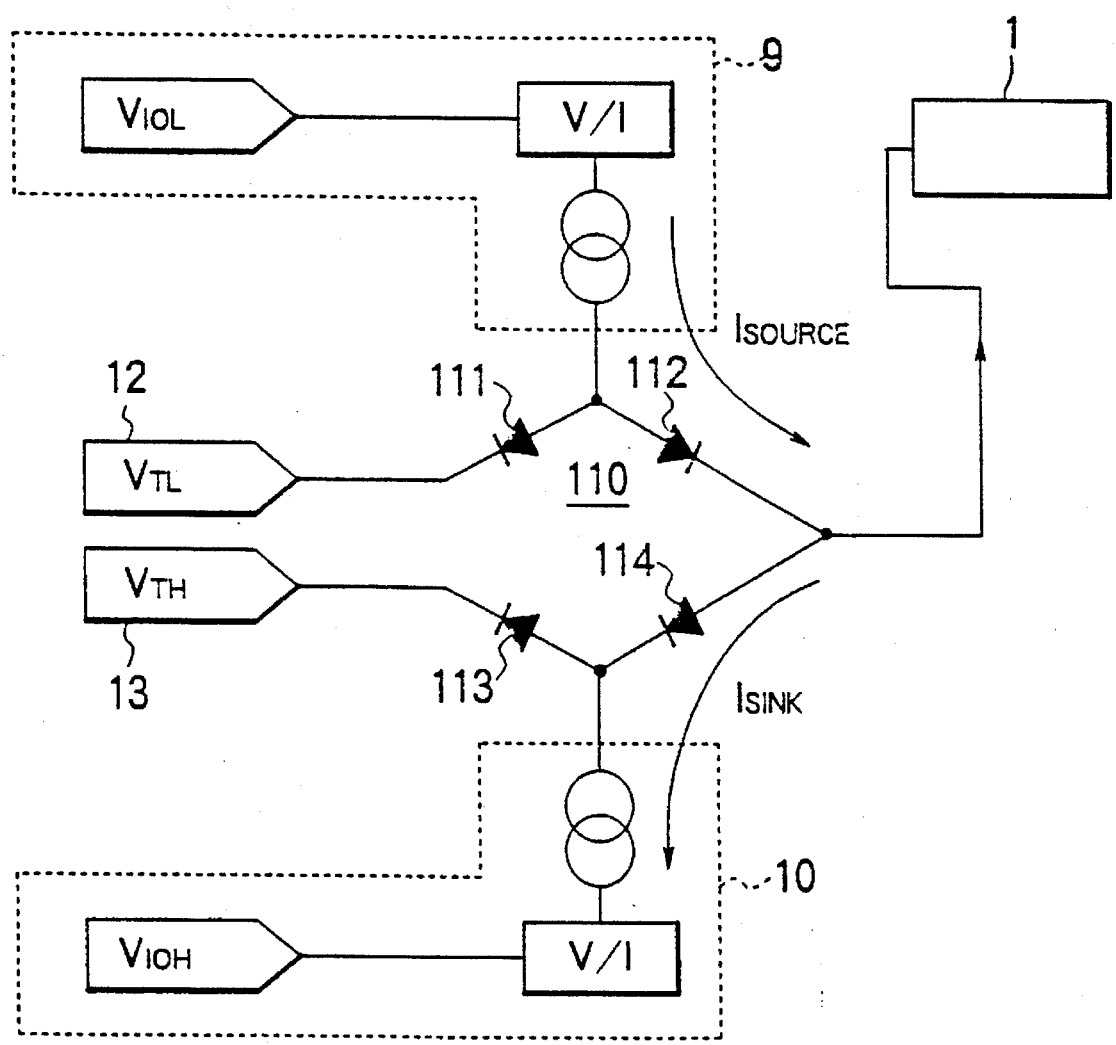
FIG. 1 is a circuit diagram of a current load circuit in a semiconductor test apparatus according to a first embodiment of the present invention.

FIG. 1 is a circuit diagram of a current load circuit provided in a pin electronics circuit of a semiconductor test apparatus according to a first embodiment of the present invention. The pin electronics circuit has the same basic configuration as shown in FIG. 4 except that the current load circuit is improved.

In FIG. 1, denoted by 6a is a current load circuit, 9 is a source current load circuit, 10 is a sink current load circuit, 12 is a first current load switching voltage setting circuit (hereinafter referred to as a first voltage setting circuit) dedicated to the source current load circuit, and 13 is a second current load switching voltage setting circuit (hereinafter referred to as a second voltage setting circuit) dedicated to the sink current load circuit. Further, 110 is a rectifying diode circuit which comprises first rectifying circuit means including diodes 111 and 112 and second rectifying circuit means consisted of diodes 113 and 114.

Figure 2:
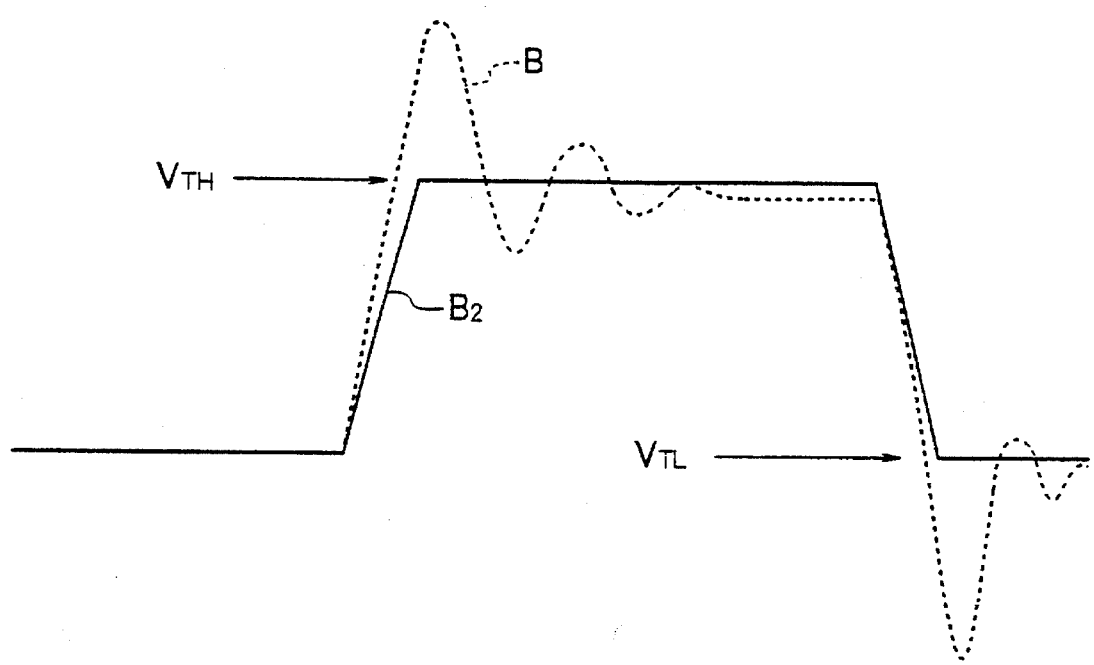
FIG. 2 is a chart of an input waveform produced by the circuit of FIG. 1.
Figure 4:
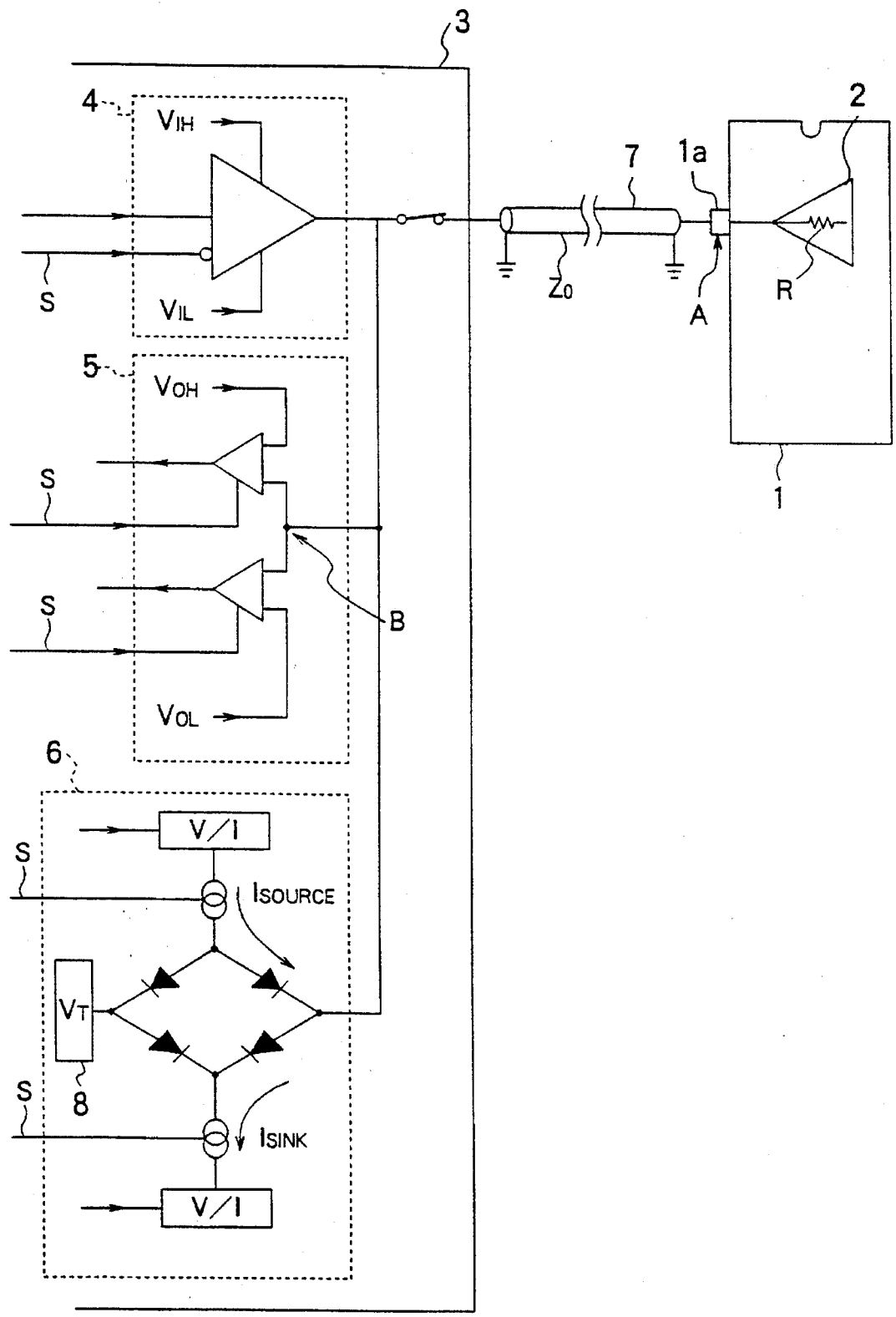
FIG. 4 is a circuit diagram showing the relationship between a pin electronics circuit and a device to be tested in a prior art semiconductor test apparatus.
Figure 5:
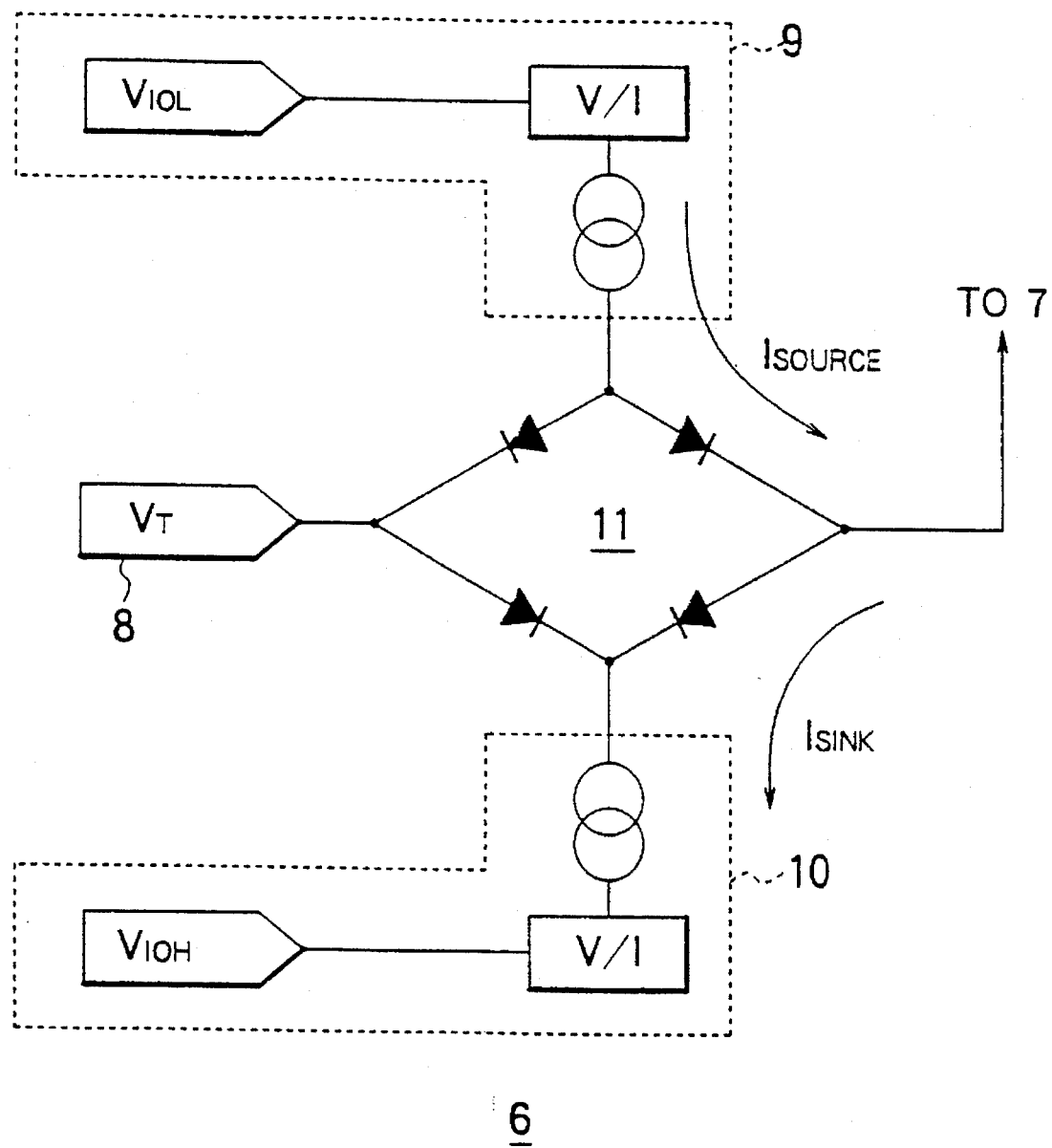
FIG. 5 is a circuit diagram of a current load circuit in the prior art semiconductor test apparatus.
Figure 6A:
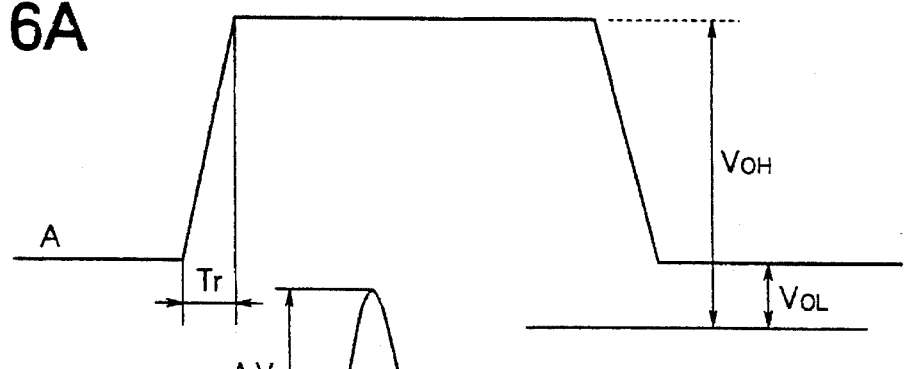
FIG. 6(A–B) is a chart showing waveforms of an output signal from the tested device and an input signal applied to the pin electronics circuit in the prior art.
Figure 6B:
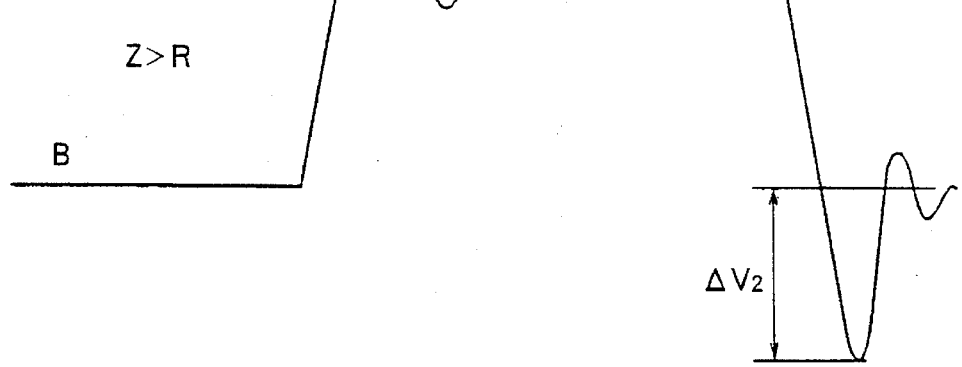
Figure 7:
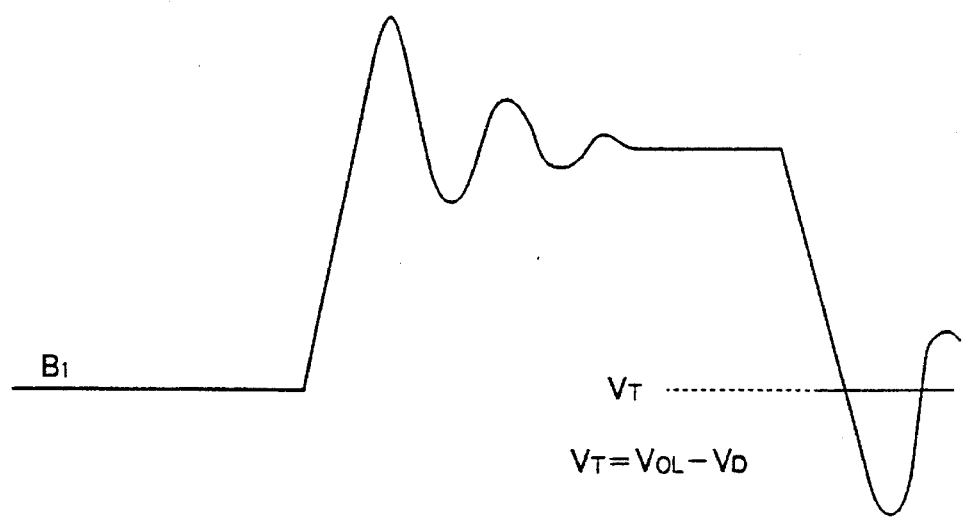
FIG. 7 is a chart of the input signal waveform showing a manner in which the ringing waveform is shaped by the prior art current load circuit.
Figure 1:
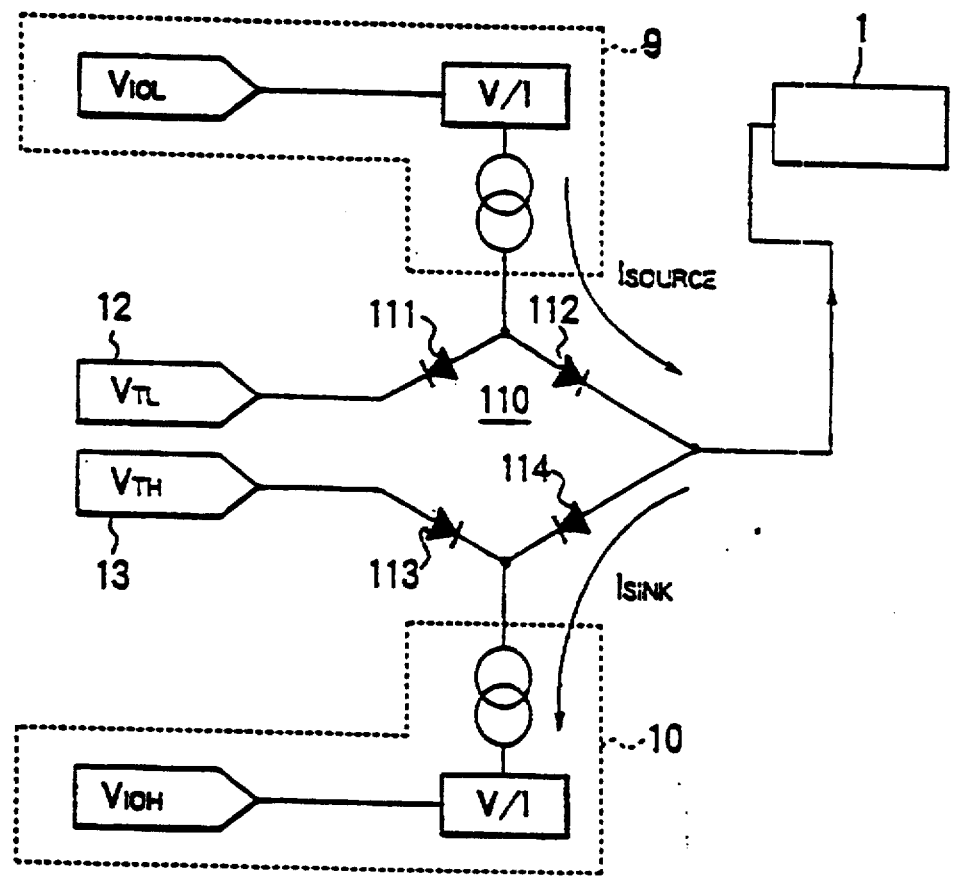
Figure 3:
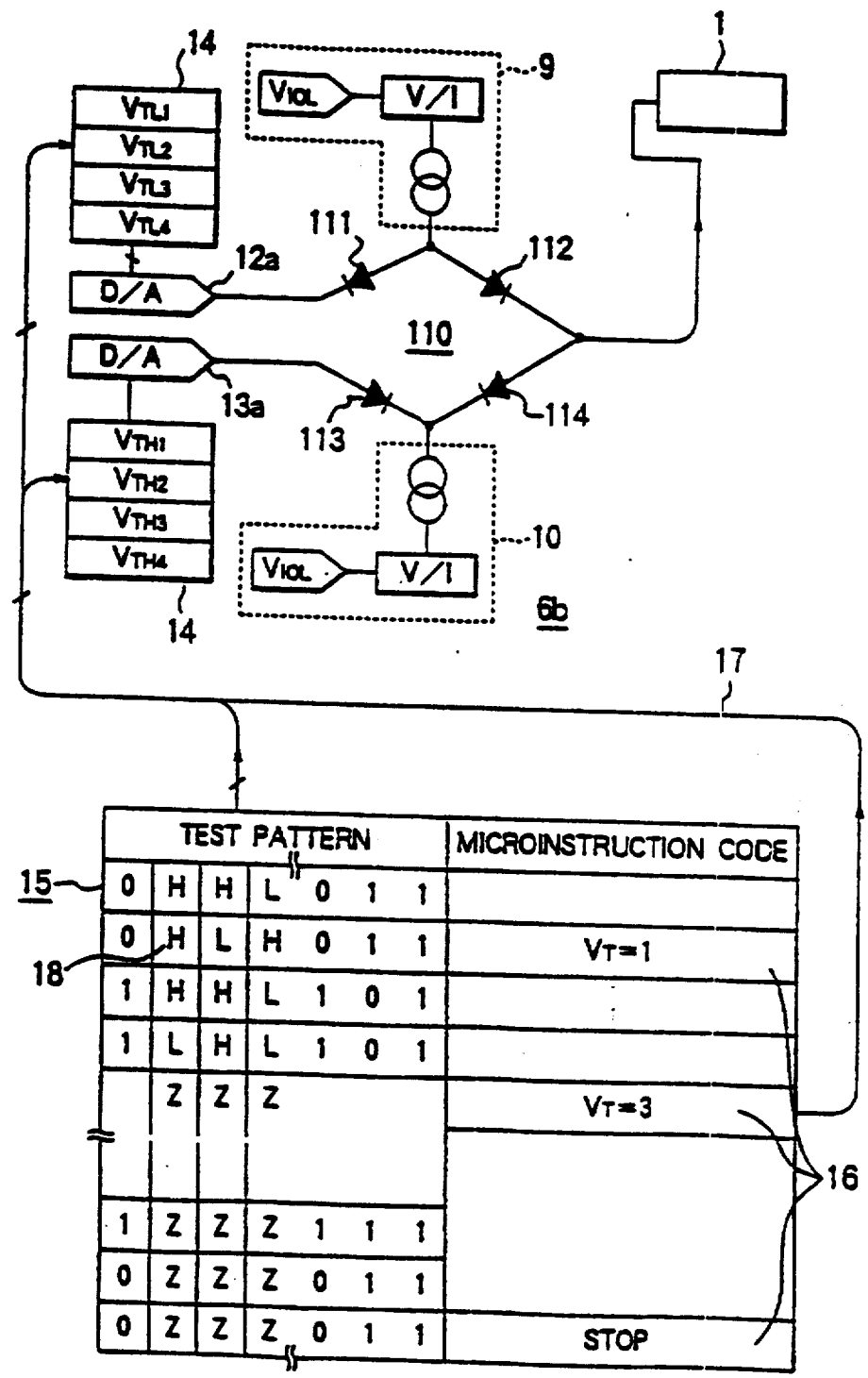

FIG. 2 shows a shaped input waveform $B_2$ appearing at the point B of the comparator circuit 5 shown in FIG. 4 when the first voltage setting circuit 12 is set to a voltage $V_{TL}$ and the second voltage setting circuit 13 is set to a voltage $V_{TH}$.

The operation of the current load circuit will now be described. By setting the first voltage setting circuit 12 to the voltage $V_{TL}$ which is defined by $V_{TL}=V_{OL}-V_D$ and the second voltage setting circuit 13 to the voltage $V_{TH}$ which is defined by $V_{TH}=V_{OH}+V_D$, a source current Isource flows to act to prevent the occurrence of ringing when the input waveform applied to the comparator circuit 5 is about to undershoot in which its low level would be lowered below the voltage $V_{TL}$, and a sink current Isink flows similarly to prevent the occurrence of ringing when the input waveform is about to overshoot in which its high level would be raised above the voltage $V_{TH}$. Accordingly, with an improvement of the prior art diode bridge circuit, a test apparatus can be realized which is able to simultaneously shape the ringing waveform on both the overshoot side, i.e., the H-level side, and the undershoot side, i.e., the L-level side.

Note that if the voltage $V_{TL}$ set by the first voltage setting circuit 12 and the voltage $V_{TH}$ set by the second voltage setting circuit 13 are selected to be equal to each other, the current load circuit would operate in the same manner as the prior art circuit.

Embodiment 2

Figure 3:
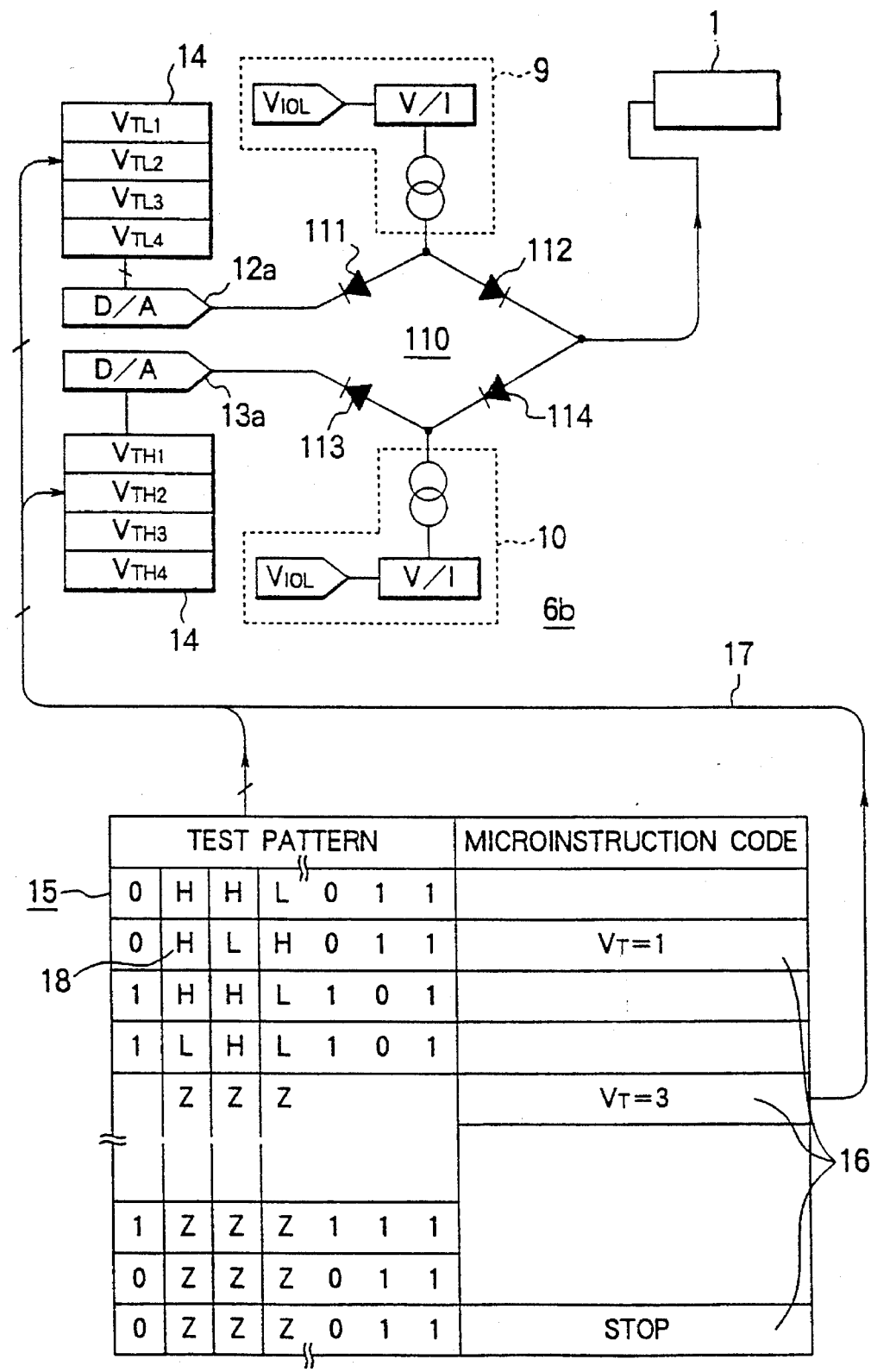
FIG. 3 is a circuit diagram of a current load circuit in a semiconductor test apparatus according to a second embodiment of the present invention.

FIG. 3 is a circuit diagram of a current load circuit provided in a pin electronics circuit of a semiconductor test apparatus according to a second embodiment of the present invention. The same parts in FIG. 3 as those in FIG. 1 are denoted by the same reference numerals and will not described here. In FIG. 3, denoted by 6b is a current load circuit, 12a is a first variable voltage setting circuit providing a variable set value, 13a is a second variable voltage setting circuit providing a variable set value, and the circuits 12a and 13a each comprise a D/A converter. Further, 14 is a register circuit for storing voltages set by the first and second variable voltage setting circuits 12a and 13a, 15 is a pattern generator for the semiconductor test apparatus, and 16 and 18 represent microinstruction code and a test pattern, respectively, both stored in the pattern generator 15. Additionally, 17 is a control signal controlled by the microinstruction code 16.

The operation of the current load circuit shown in FIG. 3 will now be described. The current load circuit in Embodiment 1 operates to effect either one of the two functions; it sets different voltages as $V_{TH}$ and $V_{TL}$ to shape the ringing waveform on both the H-level side and the L-level side, or it sets the relationship of $V_T=V_{TH}=V_{TL}$ to serve as the prior art current load circuit. By contrast, in this Embodiment 2, two or more current load switching voltages (e.g., $V_{TL1}$ to $V_{TL4}$ and $V_{TH1}$ to $V_{TH4}$) are stored in the respective register circuits 14 beforehand. During the test, the current load switching voltages of the first and second variable voltage setting circuits 12a, 13a are controlled in accordance with the microinstruction code 16 in the pattern generator 15 for various test conditions (depending on test procedures of devices to be tested).

As shown in FIG. 3, by way of example, when the microinstruction code 16 is set to $V_T=1$, $V_{TL1}$ and $V_{TH1}$ are selected as the current load switching voltage values so that the current load circuit operates to prevent the output waveform of the tested device 1 (see FIG. 4) from ringing. Also, when the microinstruction code 16 is set to $V_T=3$, $V_{TL3}$ and $V_{TH3}$ ($V_{TL3}=V_{TH3}$) are selected as the current load switching voltage values so that the current load circuit serves as the one for a high impedance test of the output buffer circuit 2 in the tested device 1. Thus, the test can be continuously executed with no interruption while changing test conditions.

Embodiment 3

In Embodiment 2, since the current load switching voltage values are controlled by the microinstruction code 16, the same control signal 17 is designated for the current load circuits 6b associated with the pins in one-to-one relation, and the current load circuits 6b each select the set values stored in the built-in register circuits 14 at the position corresponding to the control signal 17. Therefore, the set values of the current load circuits 6b are uniquely patterned with respect to the microinstruction code. By contrast, in this Embodiment 3, the set values of the current load circuits are controlled by the test pattern 18 shown in FIG. 3. The test pattern 18 comprises a set of "0", "1", "H", "L", etc., each of which is an instruction for the current load circuit 6b associated with each of the pins and is in the form of binary data of several bits. Accordingly, when the set values are controlled by the test pattern 18, they can be controlled on a pin-by-pin basis and hence more complicated control can be achieved.

As described hereinabove, according to the first invention, since a current load switching voltage setting circuit is present in each of the source and sink current load circuits, a semiconductor test apparatus is provided which includes a current load circuit capable of shaping the ringing that would otherwise produce both an overshoot and an undershoot.

Since the two current load switching voltage setting circuits in the current load circuit are each arranged to make its set voltage value variable, a semiconductor test apparatus is provided which includes a current load circuit capable of selectively serving as a conventional current load circuit and a shaping circuit to shape the ringing waveform otherwise caused during a high-speed test, as well as changing the set voltages in accordance with the test conditions.

Since the two current load switching voltage setting circuits in the current load circuit are each arranged to make its set voltage variable and the set voltages are controlled particularly in accordance with the microinstruction code from the pattern generator of the semiconductor test apparatus, a semiconductor test apparatus is provided which includes a current load circuit selectively serving as a conventional current load circuit and a shaping circuit to shape the ringing waveform otherwise caused during a high-speed test, as well as changing the set voltages in accordance with the test conditions by using other existing signals.

Since the set voltages of the two variable current load switching voltage setting circuits are controlled in accordance with a test pattern from a pattern generator so that the set voltage values may be controlled independently for each of the pin terminals, a semiconductor test apparatus is provided which includes a current load circuit achieving more sophisticated control by using other existing signals.

Finally, since the set voltage of the two variable current load switching voltage setting circuits are controlled by the register circuits driven in accordance with the test pattern from the pattern generator and the D/A converter circuits so that the set voltage values may be controlled independently for each of the pin terminals, a semiconductor test apparatus is provided which includes a current load circuit achieving more sophisticated control with a simple construction.

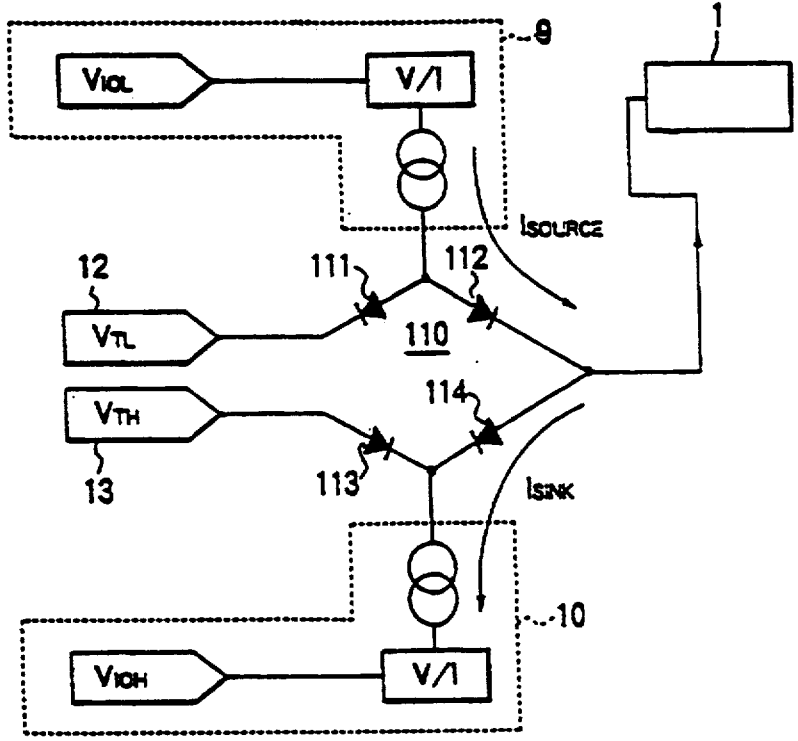

What is claimed is:

1. A semiconductor test apparatus including a current load circuit, the current load circuit comprising:

a source current load circuit for setting a source current introduced to a device to be tested, a sink current load circuit for setting a sink current drawn out of the device to be tested, first and second current load switching voltage setting circuits for setting respective first and second variable voltages, first rectifying circuit means including diodes, said first rectifying circuit means connected from said source current load circuit to a pin terminal of the device to be tested and to said first current load switching voltage setting circuit through respective diodes in the forward direction, for receiving the first variable voltage from said first current load switching voltage setting circuit, and second rectifying circuit means including diodes, said second rectifying means connected from said sink current load circuit to the pin terminal of the device to be tested through a respective one of said diodes in a reverse current direction and from said second current load switching voltage setting circuit to said sink current load circuit through respective one of said diodes in a forward current direction, for receiving the second variable voltage from said second current load switching voltage setting circuit.

2. A semiconductor test apparatus including a current load circuit, the current load circuit comprising:

a source current load circuit for setting a source current introduced to a device to be tested, a sink current load circuit for setting a sink current drawn out of the device to be tested, first and second variable current load switching voltage setting circuits for setting respective first and second variable voltages, first rectifying circuit means including diodes, said first rectifying circuit means connected from said source current load circuit to a pin terminal of the device to be tested and to said first variable current load switching voltage setting circuit through respective diodes in the forward current direction, for receiving the first variable voltage from said first current load switching voltage setting circuit, second rectifying circuit means including diodes, said second rectifying circuit means connected from said sink current load circuit to the pin terminal of the device to be tested through a respective one of said diodes in a reverse current direction and from said second variable current load switching voltage setting circuit to said sink current load circuit through a respective one of said diodes diodes in a forward current direction, for receiving the second variable voltage from said second current load switching voltage setting circuit, and means for changing the set voltages of said first and second variable current load switching voltage setting circuits in accordance with test procedures for the device to be tested.

3. A semiconductor test apparatus including a current load circuit, the current load circuit comprising:

a source current load circuit for setting a source current introduced to a device to be tested, a sink current load circuit for setting a sink current drawn out of the device to be tested, first and second variable current load switching voltage setting circuits for setting respective first and second variable voltages, first rectifying circuit means including diodes, said first rectifying circuit means connected from said source current load circuit to a pin terminal of the device to be tested and to said first variable current load switching voltage setting circuit through respective diodes in the forward current direction, for receiving the first variable voltage from said first current load switching voltage setting circuit, second rectifying circuit means including diodes, said second rectifying circuit means connected from said sink current load circuit to the pin terminal of the device to be tested through a respective one of said diodes in a reverse current direction and from said second variable current load switching voltage setting circuit to said sink current load circuit through a respective one of said diodes in a forward current direction, for receiving the second variable voltage from said second current load switching voltage setting circuit, and means for changing the set voltages of said first and second variable current load switching voltage setting circuits in accordance with microinstructions from a pattern generator of said semiconductor test apparatus.

4. A semiconductor test apparatus including a current load circuit, the current load circuit comprising:

a source current load circuit for setting a source current introduced to a device to be tested, a sink current load circuit for setting a sink current drawn out of the device to be tested, first and second variable current load switching voltage setting circuits for setting respective first and second variable voltages, first rectifying circuit means including diodes, said first rectifying circuit means connected from said source current load circuit to a pin terminal of the device to be tested and to said first variable current load switching voltage setting circuit through respective diodes in the forward current direction, for receiving said first variable voltage from said first current load switching voltage setting circuit, second rectifying circuit means including diodes, said second rectifying circuit means connected from said sink current load circuit to the pin terminal of the device to be tested through a respective one of said diodes in a reverse current direction and from said second variable current load switching voltage setting circuit to said sink current load circuit through a respective one of said diodes in a forward current direction, for receiving the second variable voltage from said second current load switching voltage setting circuit, and means for changing the set voltages of said first and second variable current load switching voltage setting circuits for each pin terminal of the device to be tested in accordance with a test pattern from a pattern generator of said semiconductor test apparatus.

5. A semiconductor test apparatus including a current load circuit, the current load circuit comprising:

a source current load circuit-for setting a source current introduced to a device to be tested, a sink current load circuit for setting a sink current drawn out of the device to be tested, first and second variable current load switching voltage setting circuits for setting respective first and second variable voltages, said first and second variable current load switching voltage setting circuits comprising first and second digital-to-analog converters, first rectifying circuit means including diodes, said first rectifying circuit means connected from said source current load circuit to a pin terminal of the device to be tested and to said first variable current load switching voltage setting circuit through respective diodes in the forward current direction, receiving the first variable voltage from said first current load switching voltage setting circuit, second rectifying circuit means including diodes, said second rectifying circuit means connected from said sink current load circuit to the pin terminal of the device to be tested through a respective one of said diodes in a reverse current direction and from said second variable current load switching voltage setting circuit to said sink current load circuit through a respective one of said diodes in a forward current direction, for receiving the second variable voltage from said second current load switching voltage setting circuit, and means including register circuits driven in accordance with a test pattern from a pattern generator of said first and second variable current load switching voltage setting circuits for each pin terminal of the device to be tested.

\* \* \* \* \*

UNITED STATES PATENT AND TRADEMARK OFFICE
CERTIFICATE OF CORRECTION

PATENT NO.  : 5,514,976
DATED       : May 7, 1996
INVENTOR(S) : Ohmura

It is certified that error appears in the above-indentified patent and that said Letters Patent is hereby corrected as shown below:

```
  Column 7, Line 63, after "rectifying" insert

--circuit--;

Column 8, Line 1, after "through" insert --a--;

Line 29, delete "diodes" (second occurrence);

Column 10, Line 1, after "circuit" delete -- - --;

Line 28, change "a" to --the--.
```

Signed and Sealed this

Sixteenth Day of July, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO.  : 5,514,976

DATED       : May 7, 1996

INVENTOR(S) : Ryuuji Ohmura

It is certified that error appears in the above-identified patent and that said Letters Patent is hereby corrected as shown below:

The title page, showing the illustrative figure, should be deleted and substitute therefor the attached title page.

In the drawings, delete sheets 1 and 3, and substitute therefor the drawing sheets, consisting of the corrected Figures 1 and 3, as shown on the attached pages.

Signed and Sealed this

Eleventh Day of March, 1997

*Attest:*

BRUCE LEHMAN

*Attesting Officer*     *Commissioner of Patents and Trademarks*

United States Patent [19]
Ohmura

[11] Patent Number: 5,514,976
[45] Date of Patent: May 7, 1996

[54] SEMICONDUCTOR TEST APPARATUS HAVING IMPROVED CURRENT LOAD CIRCUIT

[75] Inventor: Ryuuji Ohmura, Itami, Japan

[73] Assignee: Mitsubishi Denki Kabushiki Kaisha, Tokyo, Japan

[21] Appl. No.: 377,625

[22] Filed: Jan. 25, 1995

[30]    Foreign Application Priority Data

Feb. 3, 1994   [JP]   Japan .................. 6-011754

[51] Int. Cl.$^6$ ........................... G01R 15/12
[52] U.S. Cl. ........................... 324/765; 324/158.1
[58] Field of Search ............... 324/158.1, 73.1, 324/765; 371/15.1, 22.1, 22.3, 22.6, 25.1; 437/8

[56]          References Cited

U.S. PATENT DOCUMENTS

| | | | |
|---|---|---|---|
| 4,333,049 | 6/1982 | Yui et al. | 324/158.1 |
| 4,651,088 | 3/1987 | Sawada | 324/765 |
| 4,720,671 | 1/1988 | Tada et al. | 324/765 |

FOREIGN PATENT DOCUMENTS 4250373  9/1992  Japan .

OTHER PUBLICATIONS

Tsunetomo et al, "High Speed Testing Technique For CMOS LSI With High Impedance Transmission Lines", Technical Report of IEIEC ICD92-121, 1992, pp. 45–50.

*Primary Examiner*—Vinh P. Nguyen
*Attorney, Agent, or Firm*—Leydig, Voit & Mayer

[57]          ABSTRACT

A semiconductor test apparatus including a current load circuit, by which ringing otherwise caused during a high-speed digital test can be prevented on both the overshoot and undershoot sides, is provided. In a current load circuit, a source current load circuit and a sink current load circuit are associated with a first current load switching voltage setting circuit and a second current load switching voltage setting circuit, respectively, which can be set separately so that high and low levels of the signal waveform are clamped to respective potentials to clip overshoot and undershoot in the ringing waveform. A rectifying diode circuit allows a sink current to flow when overshoot is about to occur, and allows a source current to flow when undershoot is about to occur.

5 Claims, 6 Drawing Sheets